(12) United States Patent
Cheng et al.

(10) Patent No.: US 12,197,749 B2
(45) Date of Patent: Jan. 14, 2025

(54) MANAGING SYNCHRONOUS DATA TRANSFER

(71) Applicant: Macronix International Co., Ltd., Hsinchu (TW)

(72) Inventors: Shun-Li Cheng, Zhubei (TW); Shih-Chou Juan, Taoyuan (TW)

(73) Assignee: Macronix International Co., Ltd., Hsinchu (TW)

( * ) Notice: Subject to any disclaimer, the term of this patent is extended or adjusted under 35 U.S.C. 154(b) by 116 days.

(21) Appl. No.: 17/940,446

(22) Filed: Sep. 8, 2022

(65) Prior Publication Data

US 2024/0086087 A1 Mar. 14, 2024

(51) Int. Cl.
*G06F 3/06* (2006.01)
*G11C 16/32* (2006.01)

(52) U.S. Cl.
CPC .......... *G06F 3/0625* (2013.01); *G06F 3/0659* (2013.01); *G06F 3/0679* (2013.01); *G11C 16/32* (2013.01)

(58) Field of Classification Search
CPC .... G06F 3/0625; G06F 3/0659; G06F 3/0679; G11C 16/32
See application file for complete search history.

(56) References Cited

U.S. PATENT DOCUMENTS

| | | | |
|---|---|---|---|
| 9,053,014 B2 | 6/2015 | Huffman et al. | |
| 10,222,989 B1 | 3/2019 | Zitlaw | |
| 10,877,907 B2 | 12/2020 | Bruce et al. | |
| 11,544,209 B2* | 1/2023 | Ootomo | G06F 13/4291 |
| 2009/0083476 A1 | 3/2009 | Pua et al. | |
| 2010/0180182 A1 | 7/2010 | Trantham | |
| 2014/0269117 A1* | 9/2014 | Maryan | G11C 11/4093 365/193 |
| 2016/0246514 A1 | 8/2016 | Nosaka et al. | |
| 2019/0235790 A1 | 8/2019 | Koo et al. | |
| 2019/0250855 A1 | 8/2019 | Kachare et al. | |
| 2020/0004450 A1 | 1/2020 | Secatch et al. | |
| 2020/0035278 A1* | 1/2020 | Kim | G11C 8/10 |
| 2021/0247931 A1 | 8/2021 | Ellis et al. | |
| 2022/0121582 A1* | 4/2022 | Jin | G06F 13/4234 |
| 2022/0122675 A1* | 4/2022 | Kim | G06F 3/0604 |
| 2022/0189520 A1* | 6/2022 | Koizumi | G11C 7/1063 |
| 2023/0084539 A1* | 3/2023 | Lee | G06F 3/0659 711/154 |

* cited by examiner

*Primary Examiner* — Eric T Oberly
(74) *Attorney, Agent, or Firm* — Fish & Richardson P.C.

(57) ABSTRACT

Systems, methods, circuits, and apparatuses for managing integrated circuits in memory devices are provided. In one aspect, a system includes a semiconductor device configured to store data, and a controller communicatively coupled to the semiconductor device. The controller is configured to send, to the semiconductor device, an instruction requesting transmission of the data; in response to determining that a predetermined time duration has elapsed after sending the instruction, initiate transmission of a read enable signal to the semiconductor device; receive, from the semiconductor device, a data strobe signal; and, in response to determining that the data strobe signal has a frequency matching a frequency of the read enable signal, read the data from the semiconductor device.

21 Claims, 16 Drawing Sheets

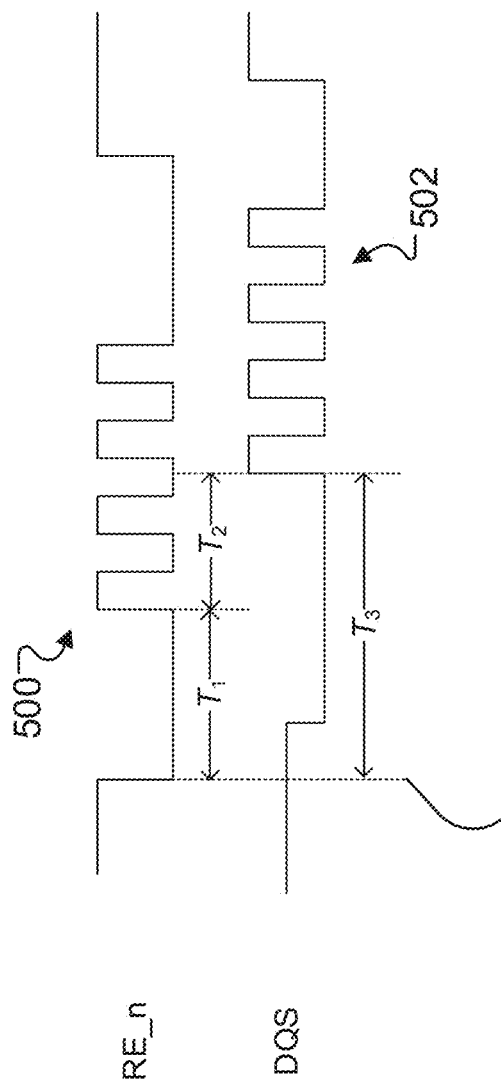

MANAGING SYNCHRONOUS DATA TRANSFER

BACKGROUND

High-density memory devices, e.g., three-dimensional (3D) NAND flash memory devices, are attractive due to the capability to increase array density by stacking more layers within a similar footprint. To facilitate data transfer, controllers and memory devices exchange commands and clock signals that allow for synchronous data transfer.

SUMMARY

The present disclosure describes systems and techniques for managing data transfer from a semiconductor device (e.g., a memory device such as flash memory) to a controller, e.g., by provision of a read enable signal from the controller to the semiconductor device when a predetermined time duration elapses after the controller sends instructions to the semiconductor device.

Some aspects of the present disclosure feature a system including: a semiconductor device configured to store data, and a controller communicatively coupled to the semiconductor device. The controller is configured to send, to the semiconductor device, an instruction requesting transmission of the data; in response to determining that a predetermined time duration has elapsed after sending the instruction, initiate transmission of a read enable signal to the semiconductor device; receive, from the semiconductor device, a data strobe signal; and, in response to determining that the data strobe signal has a frequency matching a frequency of the read enable signal, read the data from the semiconductor device.

This and other systems and components thereof described in this disclosure can have any one or more of at least the following characteristics.

In some implementations, the predetermined time duration is based on a device type of the semiconductor device.

In some implementations, the predetermined time duration is based on a number of bits stored in each cell of the semiconductor device.

In some implementations, the predetermined time duration is based on an amount of the data.

In some implementations, the controller includes a timer configured to track a period of time after sending the instruction requesting the transmission of the data, and the controller is configured to determine that the predetermined time duration has elapsed by determining that the period of time tracked by the timer reaches a value of the predetermined time duration.

In some implementations, the controller is configured to, subsequent to sending the instruction requesting transmission of the data, output a periodic signal, and the controller is configured to determine that the predetermined time duration has elapsed by determining a number of cycles of the periodic signal.

In some implementations, the controller includes a read enable pin and is configured to: in a time period between sending the instruction and initiating the transmission of the read enable signal, send a constant signal to the semiconductor device through the read enable pin; and, in response to determining that the predetermined time duration has elapsed after sending the instruction, initiate transmission of the read enable signal to the semiconductor device through the read enable pin.

In some implementations, the data strobe signal includes a phase-shifted version of the read enable signal.

In some implementations, the controller includes a strobe signal pin, and the semiconductor device is configured to: in response to receiving the instruction requesting transmission of the data, prepare the data for transmission; determine that the prepared data is ready for transmission; and, in response to determining that the prepared data is ready for transmission, send, to the strobe signal pin of the controller, the data strobe signal.

In some implementations, the semiconductor device is configured to, in response to determining that the prepared data is ready for transmission, send the data to the controller in synchronicity with the data strobe signal sent to the controller.

In some implementations, the semiconductor device is configured to send, to the strobe signal pin of the controller, a constant signal, and the semiconductor device is configured to send the data strobe signal to the controller by switching from (i) sending the constant signal to the strobe signal pin to (ii) sending the data strobe signal to the strobe signal pin.

In some implementations, the semiconductor device includes a transistor. The transistor includes an input node arranged to receive the read enable signal, an output node communicatively coupled to the strobe signal pin of the controller, and a switching node. The semiconductor device is configured to send the data strobe signal by providing, at the switching node, a signal that causes the data strobe signal to be sent from the output node to the controller.

In some implementations, the semiconductor device includes a multiplexer. The multiplexer includes a first input node arranged to receive the read enable signal, a second input node arranged to receive a constant signal from a line of the semiconductor device, an output node communicatively coupled to the strobe signal pin of the controller, and a switching node. The semiconductor device is configured to send the data strobe signal to the controller by providing, at the switching node, a signal that switches the multiplexer from (i) providing the constant signal from the second input node at the output node to (ii) providing the data strobe signal, associated with the read enable signal from the first input node, at the output node.

In some implementations, the controller is configured to, in response to determining that the data has been read from the semiconductor device, end transmission of the read enable signal to the semiconductor device.

In some implementations, the controller is configured to read the data from the semiconductor device by synchronizing data reading with the data strobe signal received from the semiconductor device.

In some implementations, the system includes a communication bus coupling the semiconductor device to the controller.

In some implementations, the semiconductor device includes a flash memory device.

Some aspects of the present disclosure feature a semiconductor device including a read enable in pin and a strobe signal out pin. The semiconductor device is configured to receive, from a controller, an instruction requesting transmission of data; in response to receiving the instruction requesting transmission of the data, prepare the data for transmission; receive, at the read enable in pin, from the controller, a read enable signal; determine whether the prepared data is ready for transmission; and in response to determining that the prepared data is ready for transmission, send, to the controller from the strobe signal out pin, a data strobe signal having a frequency matching a frequency of the read enable signal.

This and other semiconductor devices described in this disclosure can have any one or more of at least the following characteristics.

In some implementations, the semiconductor device includes a transistor. The transistor includes an input node arranged to receive the read enable signal, an output node communicatively coupled to the strobe signal out pin, and a switching node. The semiconductor device is configured to send the data strobe signal by providing, at the switching node, a signal that causes the data strobe signal to be sent from the output node to the controller.

In some implementations, the semiconductor device includes a multiplexer. The multiplexer includes a first input node arranged to receive the read enable signal, a second input node arranged to receive a constant signal from a line of the semiconductor device, an output node communicatively coupled to the strobe signal out pin, and a switching node. The semiconductor device is configured to send the data strobe signal to the controller by providing, at the switching node, a signal that switches the multiplexer from (i) providing the constant signal from the second input node at the output node to (ii) providing the data strobe signal, associated with the read enable signal from the first input node, at the output node.

Some aspects of the present disclosure feature a device controller that includes a read enable pin; a strobe signal pin; at least one processor; and at least one non-transitory medium storing instructions executable by the at least one processor to: send, to a semiconductor device communicatively coupled to the device controller, an instruction requesting transmission of data; in response to determining that a predetermined time duration has elapsed after sending the instruction, initiate transmission of a read enable signal to the semiconductor device from the read enable pin; receive, from the semiconductor device at the strobe signal pin, a data strobe signal; and, in response to determining that the data strobe signal has a frequency matching a frequency of the read enable signal, read the data from the semiconductor device.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 5 is a timing diagram illustrating examples of signals, according to one or more implementations of the present disclosure.

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1A:
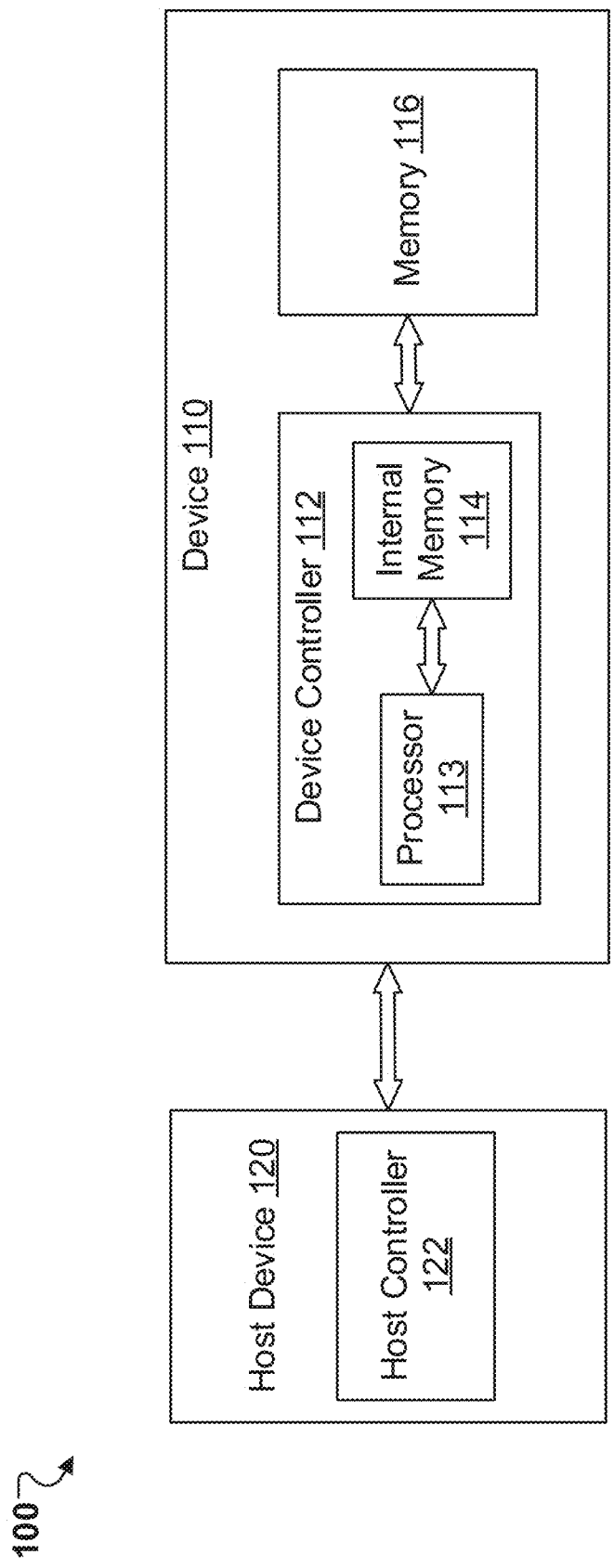
FIG. 1A illustrates an example of a system including a memory, according to one or more implementations of the present disclosure.

Data transfer from a semiconductor device storing data (e.g., a memory) to a controller involves a coordinated exchange of signals. However, because timings associated with data transfer (e.g., the time required to prepare data for transfer) may not be known exactly in advance, poorly-optimized timings can result in unnecessary power dissipation and/or delays in data transfer.

In some implementations, a controller is configured to send a periodic read enable signal to a semiconductor device such as a memory. The read enable signal serves as a clock signal for a corresponding data strobe signal sent from the memory to the controller, where data transfer from the memory to the controller is synchronized with the data strobe signal. However, transmission of the read enable signal is associated with power consumption, such that too-early transmission of the read enable signal (e.g., while the memory is still busy) may unnecessarily increase power consumption in a data transfer process or cause data corruption. Conversely, transmission of the read enable signal may be based on a response to a read status command polling by the controller. However, because of poorly-aligned timings between data preparation states and read status command signals, this protocol may cause undue delays in data transfer. A ready/busy pin of the controller can alternatively or additionally be used to determine whether data at a memory is ready for transmission. However, because the controller may have fewer ready/busy pins than a number of memories communicatively coupled to the controller (e.g., only one ready/busy pin when multiple memories are communicatively coupled to the controller), disambiguation of signals at the ready/busy pin can be associated with data transfer delays and/or errors.

Implementations of the present disclosure provide methods, devices, systems, and techniques for improving synchronous data transfer based on a read enable signal, which can reduce power consumption and the time required to transfer data, improving device performance.

In some implementations, transmission of the read enable signal is timed based on a predetermined time duration, which may be a constant value or determined based on one or more parameters. The predetermined time duration is configured to reduce a time during which the read enable signal is transmitted while data is not yet fully ready for transmission. The predetermined time duration can be also configured so that transmission of the read enable signal is initiated before the data is ready for transmission. In such a way, when the memory determines that the data is ready, the memory can initiate data strobe signal transmission without further delays. The data strobe signal has a frequency matching that of the read enable signal, so that data transmission and reception timed synchronously with the data strobe signal can be facilitated.

In some implementations, the semiconductor device from which data is transferred (e.g., a memory) is configured to facilitate transmission of the data strobe signal from the memory to the controller. The memory can include a controllable switching device such as a multiplexer or a transistor. The read enable signal is input to a node of the switching node. The memory can adjust a signal at a switching node of the switching device based on whether the requested data is ready for transfer. When the data is ready for transfer, the memory configures the signal so that the read enable signal is redirected to the controller as the data strobe signal. This can improve timing characteristics of the data strobe signal and reduce power and circuit complexity associated with data strobe signal synthesis.

The techniques and circuit configurations can be implemented for any type of semiconductor device that stores data to be transferred to another device or portion of a device. In some implementations, the data transfer can be performed using less power, e.g., by limiting a time duration during which a periodic read enable signal is transmitted from a controller to a semiconductor device. In some implementations, the data transfer can be performed more quickly, e.g., by reducing or eliminating delays after the semiconductor device has prepared requested data for transfer. In some implementations, the data transfer can be performed at timings that are fully compatible with the controller, e.g., because data transfer is synchronized with a data strobe signal that has a same frequency as a read enable signal sent from the controller. In some implementations, because a semiconductor device includes a switching device that redirects a read enable signal from the semiconductor device to a controller as the data strobe signal, circuit complexity, power consumption, and timing errors associated with data strobe signal synthesis can be reduced.

The techniques described herein can be applied to different types of storage and memory systems, e.g., two-dimensional (2D) storage and memory systems or three-dimensional (3D) storage memory systems. The techniques can be applied to various storage and memory types, such as SLC (single-level cell) devices, or MLC (multi-level cell) devices like 2-level cell devices or TLC (triple-level cell) devices. The techniques can be applied to various types of non-volatile storage and memory devices, such as Static Random Access Memory (SRAM), Dynamic Random Access Memory (DRAM), flash memory such as NOR flash memory and/or NAND flash memory, resistive random-access memory (RRAM), magnetoresistive random-access memory (MRAM), or phase-change random-access memory (PCRAM), among others. Additionally or alternatively, the techniques can be applied to various types of devices and systems, such as secure digital (SD) cards, embedded multimedia cards (eMMC), solid-state drives (SSDs), or embedded systems, among others.

FIG. 1A illustrates an example of a system 100. The system 100 includes a device 110 and a host device 120. The device 110 includes a device controller 112 and a memory 116. The device controller 112 includes a processor 113 and an internal memory 114. In some implementations, the device 110 includes a plurality of memories 116 that are coupled to the device controller 112. The host device 120 includes a host controller 122 that can include at least one processor and at least one memory coupled to the at least one processor and storing programming instructions for execution by the at least one processor to perform one or more corresponding operations.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. The memory 116 can be a semiconductor device. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk.

The memory 116 includes a plurality of blocks. The memory 116 can be a two-dimensional (2D) memory including 2D memory blocks. The memory 116 can also be a three-dimensional (3D) memory including 3D memory blocks.

Figure 1B:
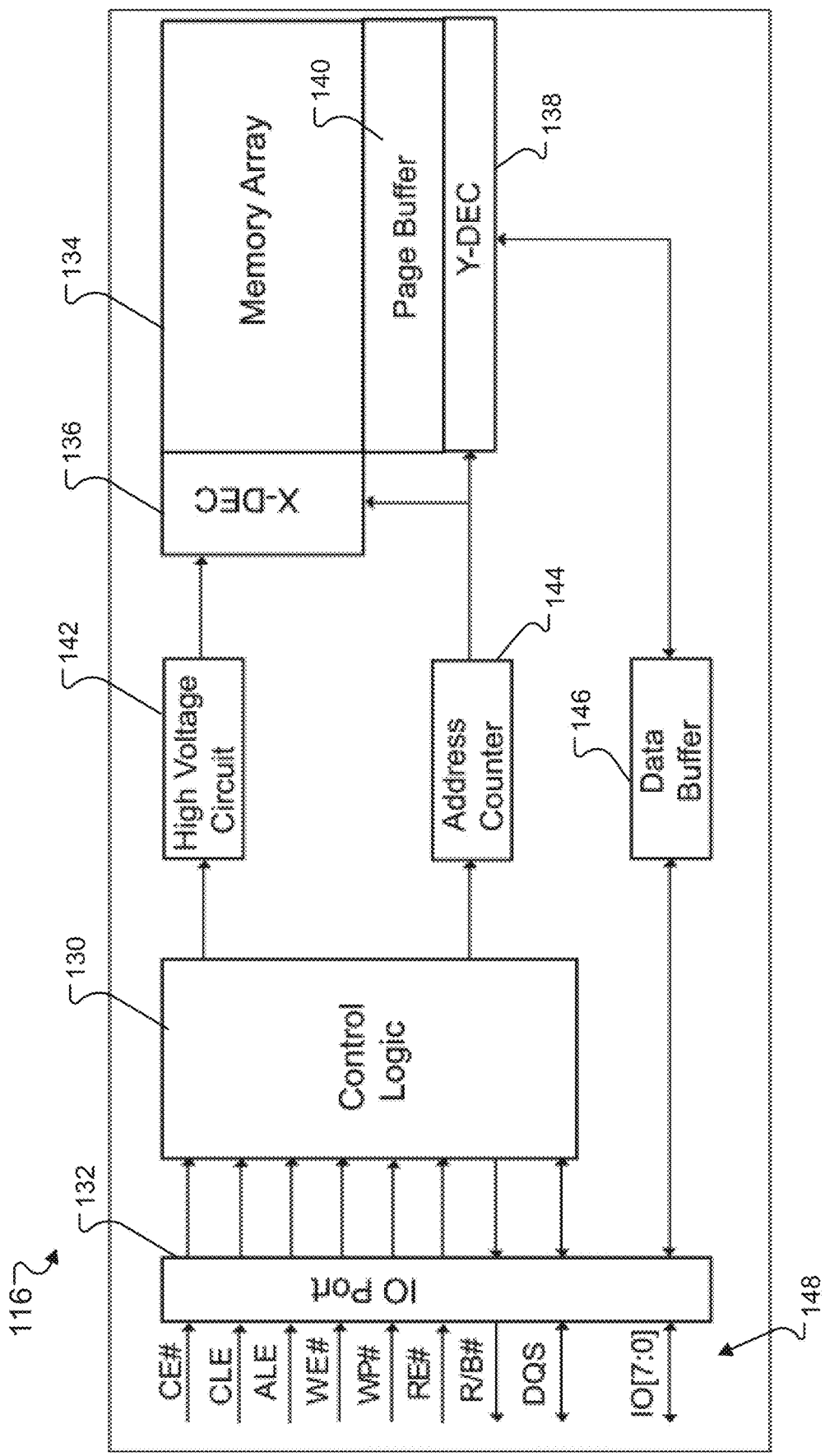
FIG. 1B illustrates an example of a memory, according to one or more implementations of the present disclosure.

FIG. 1B illustrates an example of the memory 116, such as a NAND flash memory die. As shown in FIG. 1B, the memory 116 is provided with basic circuit blocks, such as a control logic unit 130, an I/O port unit 132, a memory array 134, an X-decoder 136, a Y-decoder 138, a page buffer 140, a high voltage circuit 142, an address counter 144, and a data buffer 146. These basic circuit blocks together operate to read data from and store data in the memory array and to receive data from and transmit data to one or more other devices, such as controllers; a detailed description of the circuit blocks and their operation is omitted here. In some implementations, the memory 116 includes a switching device (not shown in FIG. 1B), such as switching device 602.

The I/O port unit 132 includes multiple pins 148, which can vary in different implementations. In the example of FIG. 1B, the pins include CE #, CLE, ALE, CLE, WE #, WP #, RE #, R/B #, DQS, and IO[7:0]. The CE #(chip enable) pin is configured to receive chip enable signals from a controller (e.g., controller 112 or 122) to select the memory 116 for data exchange. The CLE (command latch enable) and ALE (address latch enable) are configured to receive indications of types of bus cycle (e.g., command, address, and data). The WE #(write enable) pin is configured to receive signals to control latching of commands, addresses, and data. The WP #(write protect) pin is for write protect signals. The RE #(read enable) pin (sometimes referred to as a read enable in pin) is configured to receive data from a controller indicating that the controller is ready to read data from the memory 116. The R/B #(ready/busy) pin is configured to transmit signals (e.g., to a controller) indicating whether the memory 116 is ready for data transfer. The DQS pin (sometimes referred to as a strobe signal out pin) is configured to transmit (e.g., to a controller) a data strobe signal that indicates timing for data transfer. The IO[7:0] pins are configured for data input/output.

In some implementations, one or more of these pins are not included, e.g., have functions integrated together with another described pin or have functions that are not implemented. For example, in some implementations, operations described in this disclosure with respect to the RE #pin or the DQS pin of the memory 116 can be performed using other pin(s) shown in FIG. 1B, in which case the pin(s) performing these functions can be described as read enable signal in pins and strobe signal out pins. Moreover, in some implementations a memory can includes one or more additional pins without departing from the scope of this disclosure.

Figure 2:
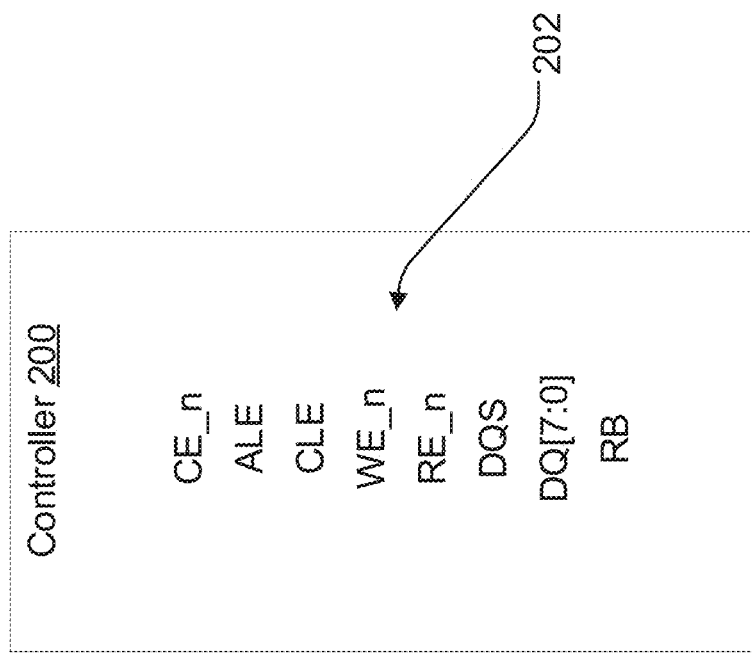
FIG. 2 illustrates an example of a controller, according to one or more implementations of the present disclosure.

FIG. 2 illustrates an example of a controller 200 that can be interoperably coupled with one or more semiconductor devices, such as memory 116. The controller 200 can be, for example, device controller 112 or host controller 122 as described in FIG. 1A.

The controller 200 includes pins 202 that can receive and/or transmit signals. In various implementations, as illustrated in FIG. 2, the pins 202 can include one or more of: CE_n, ALE, CLE, WE_n, RE_n, DQS, DQ[7:0], and RB. The CE_n (chip enable) pin is configured to select target devices (such as memories) for data exchange to/from the controller 200. The ALE (address latch enable) and CLE (command latch enable) pins are configured to indicate types of bus cycle (e.g., command, address, and data). The WE_n (write enable) pin is configured to control latching of commands, addresses, and input data. The RE_n (read enable) pin is configured to indicate to a communicatively-coupled semiconductor device that the controller 200 is ready to read data from the semiconductor device, and to facilitate synchronization of data transfer. The DQS (data strobe) is configured to receive a data strobe signal that indicates timing for data transfer. The DQ[7:0] pins, which are also called in/out (I/O) pins, are configured to transfer address data, command data, and/or other data. The RB (ready/busy) pin is configured to receive signals from communicatively-coupled semiconductor devices indicating whether the semiconductor devices are ready for data transfer.

Figure 3:
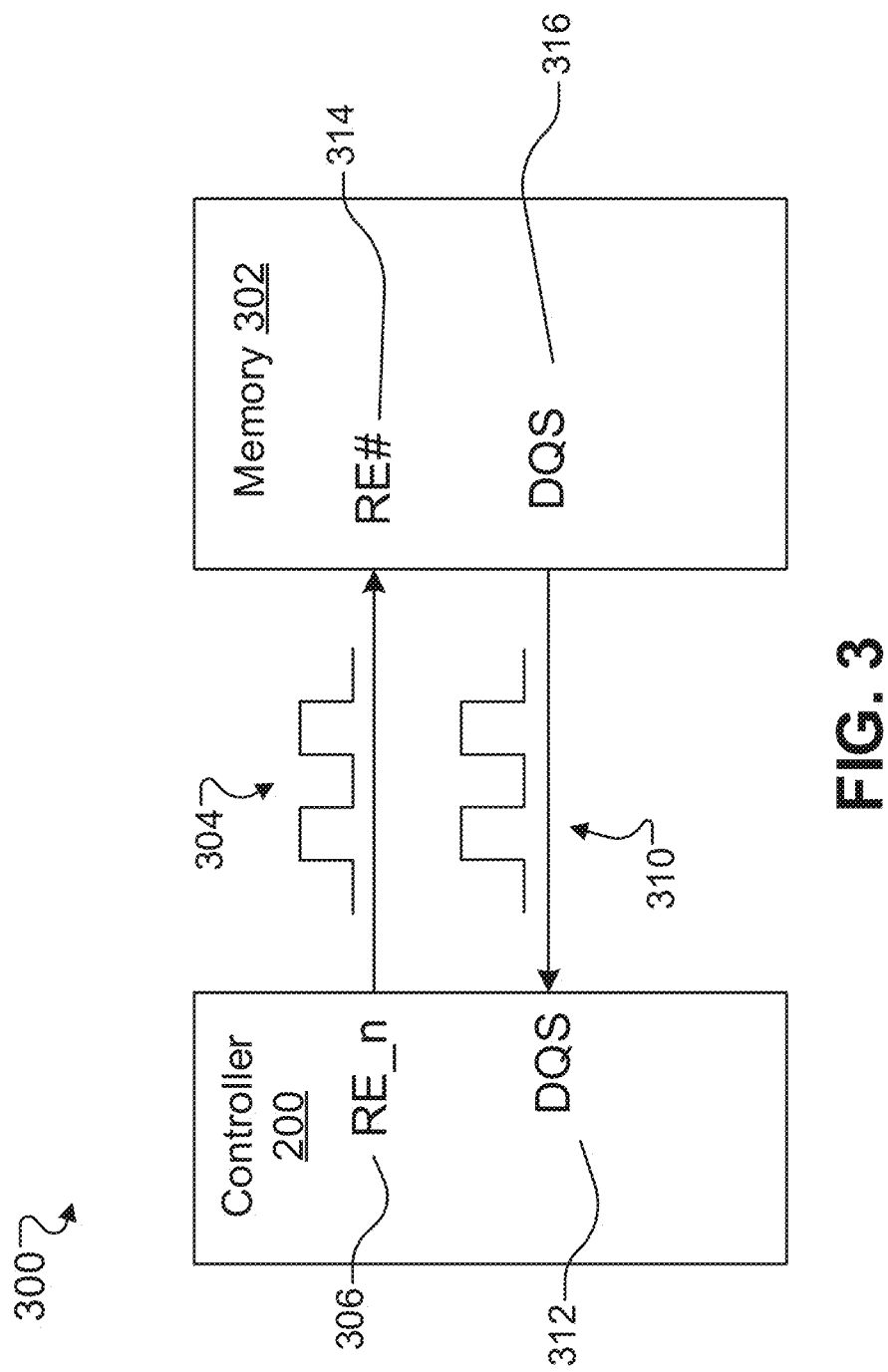
FIG. 3 illustrates an example of a system including a controller and a memory, according to one or more implementations of the present disclosure.

FIG. 3 illustrates a portion of an example of a data transfer process in a system 300 including the controller 200 communicatively coupled to a semiconductor device, in this example a memory 302 (e.g., memory 116 of FIGS. 1A-1B). The memory 302 can include pins corresponding to pins (e.g., the pins 202 of FIG. 2) of the controller 200.

In some implementations, the controller 200 sends a periodic read enable signal 304 from the RE_n pin 306 of the controller 200 to the memory 302. The memory 302 receives the read enable signal 304 (e.g., at a corresponding RE #pin 314 of the memory 302). In response to receiving the read enable signal 304, the memory 302 starts to prepare requested data for transfer. When the data is ready for transfer, the memory 302 outputs a data strobe signal 310 that can have a frequency matching that of the read enable signal 304 (e.g., from a DQS pin 316 of the memory 302). The data strobe signal 310 is received at a DQS pin 312 of the controller 200 and serves to synchronize data sending from the memory 302 with data reading by the controller 200. For example, in the context of double data rate (DDR) data transfer (e.g., when the memory 302 is a NAND flash memory), the memory 302 can send data to the controller 200, and the controller 200 can read the data from the memory 302, on rising edges and falling edges of the data strobe signal 310.

Figure 4A:
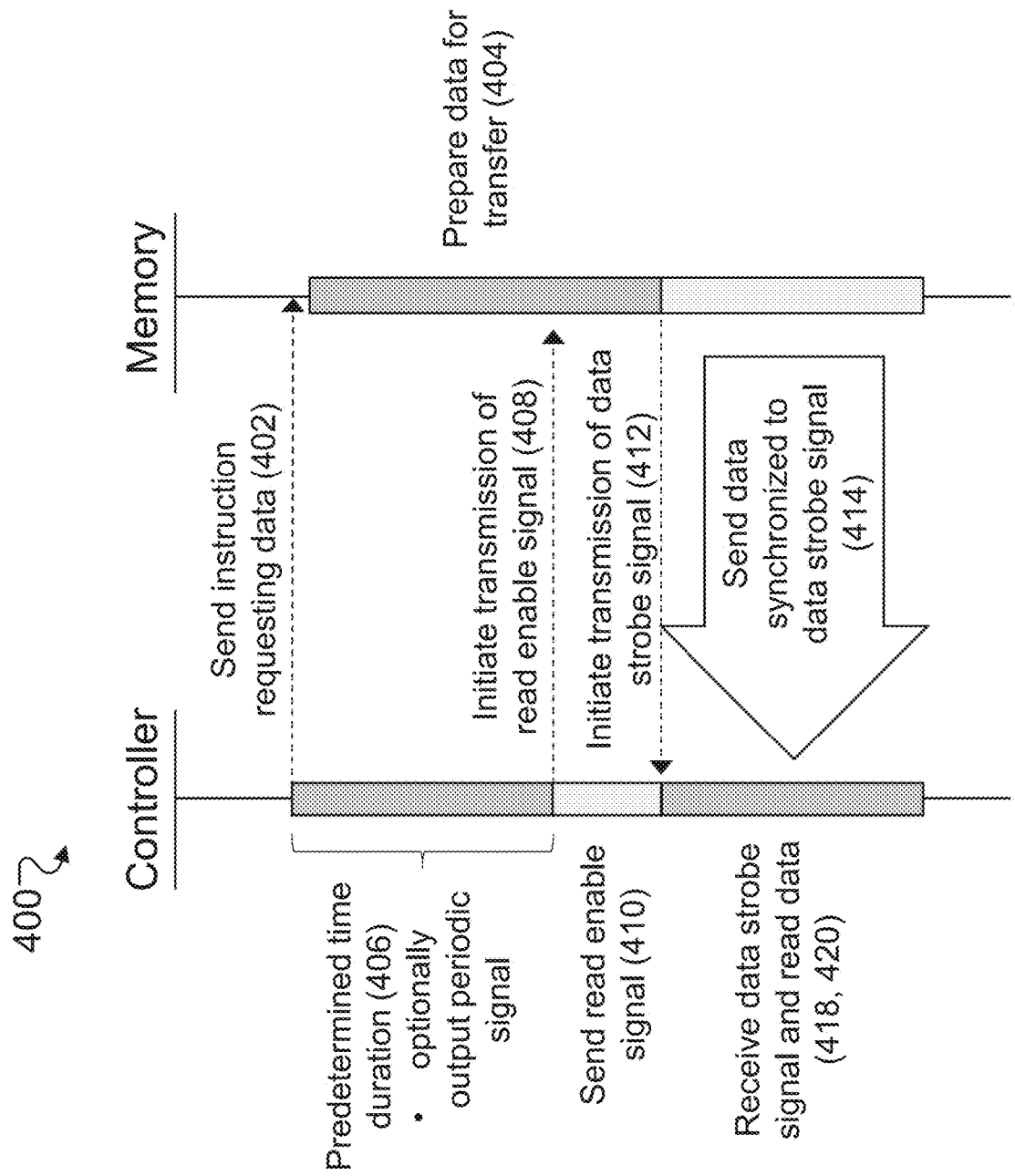
FIGS. 4A-4C are flow charts illustrating examples of data transfer processes, according to one or more implementations of the present disclosure.
Figure 4B:
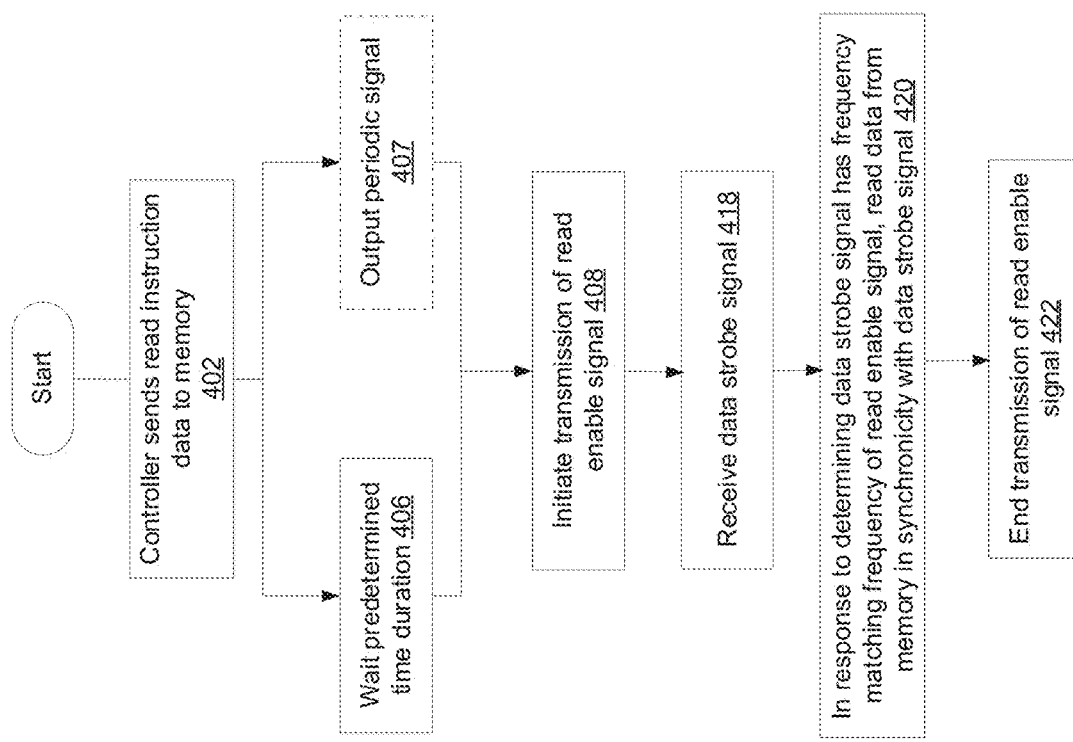
Figure 4C:
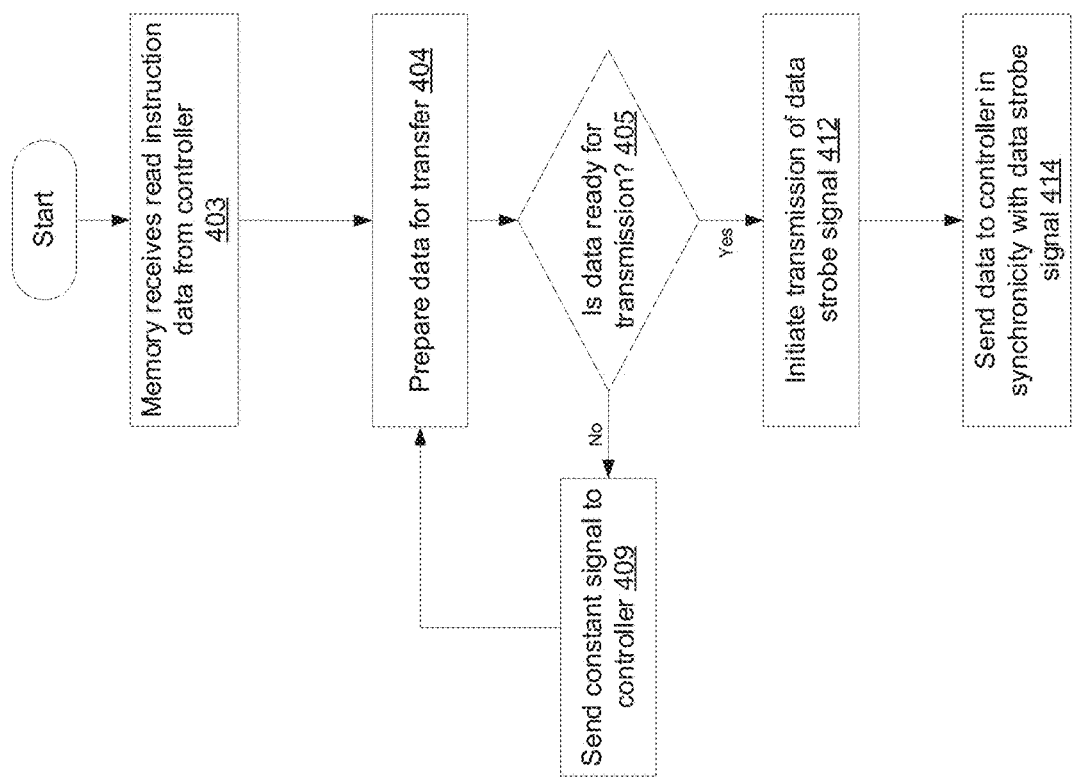

FIGS. 4A-4C illustrate an example of a process 400 for data transfer from a semiconductor device (e.g., a memory, such as memory 302) to a controller (e.g., controller 200) based on the configuration shown in FIG. 3. Timing of transmission of a read enable signal in the process 400 is controlled to improve power consumption and/or improve data transfer speed compared to some alternative processes, as described in detail below.

In the process 400, the controller sends an instruction to the memory requesting transmission of data stored in the memory (402). For example, the controller can use a CE_n pin to select the memory from among multiple addressable memories and can send read instruction data to the memory using a CLE pin and/or a DQ[7:0] pin. In response, the memory begins preparing the data for transfer (404). For example, the memory can prepare the data for transfer by loading the data or a portion thereof into the data buffer 146 and/or the page buffer 140 of FIG. 1B.

After sending the instruction, the controller does not immediately initiate transmission of a read enable signal but, rather, first waits for a predetermined time duration (406). The inclusion of the predetermined time duration is based on the recognition that the memory may require a non-zero time duration in which to prepare the data for transfer. A read enable signal sent while the memory is busy preparing the data would serve no useful function but can cause high power consumption. To reduce the power consumption, it can be desirable to wait to send the read enable signal until the memory has prepared the data or is close to having prepared the data.

For example, FIG. 5 illustrates an example of signals sent from an RE_n pin (e.g., 306 of FIG. 3) of a controller (e.g., 200 of FIGS. 2 and 3) and from a DQS pin (e.g., 316 of FIG. 3) of a memory (e.g., 302 of FIG. 3), respectively. From a time point 504 at which read instruction data is sent to the memory and the memory begins preparing data for transfer, the memory requires a time duration $T_3$ before the data is prepared. Accordingly, the controller can wait for the time duration $T_3$ before initiating transmission of a read enable signal 500. However, in practice, the time duration $T_3$ is not known exactly. Factors, e.g., process-to-process variation, a storage configuration of the requested data in the memory, an initial state of the memory, an amount of requested data, and/or any other factors, can cause $T_3$ to vary between data read operations, and at least some of these factors may not be known to the controller.

In some implementations, as illustrated in FIG. 5, $T_3$ is treated as a sum of a predetermined time duration $T_1$ and an unknown, variable time duration $T_2$. The controller waits the predetermined time duration $T_1$ before initiating transmission of the read enable signal 500, and $T_1$ can be selected/determined so that $T_1$ is likely to be close to $T_3$ without being greater than $T_3$. If $T_1$ is excessively short in comparison to $T_3$, then $T_2$ can be correspondingly long, and power can be wasted in transmission of the read enable signal 500 during $T_2$. If $T_1$ is greater than $T_3$, then data transfer can be delayed unnecessarily as the memory waits to receive the read enable signal 500 before sending data strobe signal 502 to the controller.

In some implementations, the predetermined time duration $T_1$ is a constant value, e.g., a constant value employed by the controller or a class of controllers for reading data in various different circumstances. In some implementations, the predetermined time duration $T_1$ is determined by the controller based on one or more parameters. The one or more parameters can include one or more of at least: a type (e.g., model or configuration) of the controller; a type (e.g., model or configuration) of the memory (e.g., a number of bits stored in each cell of the memory, such as SLC, MLC, or TLC); a type of interface/bus connecting the controller and the memory (e.g., Open NAND Flash Interface (ONFI) or Toggle); a number and/or type of one or more other devices communicatively coupled to the controller and/or the memory; an amount of data requested to be transferred from the memory to the controller (e.g., a number of bits, bytes, or another data unit), where a larger amount of data can correspond to a longer predetermined time duration $T_1$; a timing parameter (e.g., a value) stored in the controller or the memory; or another parameter that may increase or decrease the time $T_3$ consumed in preparing the data for transfer.

The controller can use various methods to determine that the predetermined time duration has elapsed. In some implementations, the controller uses a software and/or hardware-implemented timer, e.g., a timer that is started when the controller sends the instruction to the memory. When the timer reaches a value indicative of the predetermined time duration, the controller determines that the predetermined time duration has elapsed.

In some implementations, referring to FIG. 4B, the controller generates and/or outputs a periodic signal (407) and uses the periodic signal to determine when the predetermined time duration has elapsed. For example, the periodic signal can be a read status command signal or other signal that the controller may use in some circumstances to poll a status of memory devices. In some implementations according to this disclosure, the read status command signal is not an essential element of the data transfer process, because the controller determines the status of a corresponding memory device based on receiving a data strobe signal from the memory device (not based on a read status command signal). However, in some implementations, the controller nevertheless generates and/or outputs the read status command signal, which is periodic (e.g., includes intermittent 300 ns polling sequences separated by 600 ns durations). Based on a number of cycles of the periodic signal, the controller can determine that the predetermined time duration has elapsed. For example, the controller can determine that the predetermined time duration has elapsed when the number of cycles equals or exceeds a threshold number of cycles. In some implementations, the periodic signal is output from a pin distinct from the DQS pin and the RE_n pin, such as a DQ[7:0] pin, e.g., as illustrated in FIG. 2.

Referring again to FIGS. 4A-4C, in response to determining that the predetermined time duration has elapsed, the controller initiates transmission of the read enable signal to the memory (408). The read enable signal is a periodic signal having a frequency, such that a signal of the same frequency can be sent from the memory to the controller to serve as a clock signal for data reading, as described in further detail below. For example, in some implementations the read enable signal is a square wave signal, a trapezoidal wave signal, or another type of periodic signal.

From the memory's perspective, as shown in FIG. 4C, in response to receiving the instruction requesting data from the controller (403), the memory prepares the data for transfer (404). While the data is not yet ready for transmission, the memory can send a constant signal (e.g., a low signal, a high signal, or a floating signal) to the controller (409). For example, the constant signal can be sent from the memory to the controller using the DQS pin of the memory from which a data strobe signal can be sent later in the process 400. Based on receiving the constant signal, the controller can determine that the memory is still busy preparing the data for transfer.

The memory determines whether the data is ready for transmission (405). In response to determining that the data is ready for transmission, the memory initiates transmission of the data strobe signal to the controller (412). The data strobe signal is a periodic signal having a frequency matching the frequency of the read enable signal, and the memory is configured to provide the data strobe signal at the frequency matching the frequency of the read enable signal. For example, in some implementations, the data strobe signal has a same waveform shape as the read enable signal, e.g., both can be a square wave signal or a trapezoidal wave signal. In some implementations, the data strobe signal has a waveform shape different from that of the read enable signal. In some implementations, the data strobe signal is phase-shifted with respect to the read enable signal. In some implementations, the data strobe signal has a different magnitude than the read enable signal, e.g., is attenuated or amplified compared to the read enable signal. In some implementations, the read enable signal alternates periodically between a high level and a low level, and the data strobe signal alternates periodically between the high level and the low level.

In various implementations, various methods can be employed by the memory to generate the data strobe signal and send the data strobe signal to the controller. In some implementations, the memory measures the frequency of the read enable signal and uses an internal signal generator (e.g., a clock generator) to synthesize the data strobe signal so that the data strobe signal has a frequency matching the frequency of the read enable signal.

In some implementations, the memory includes a switching device, such as a multiplexer or a transistor, configured to receive the read enable signal and output the data strobe signal.

Figure 6A:
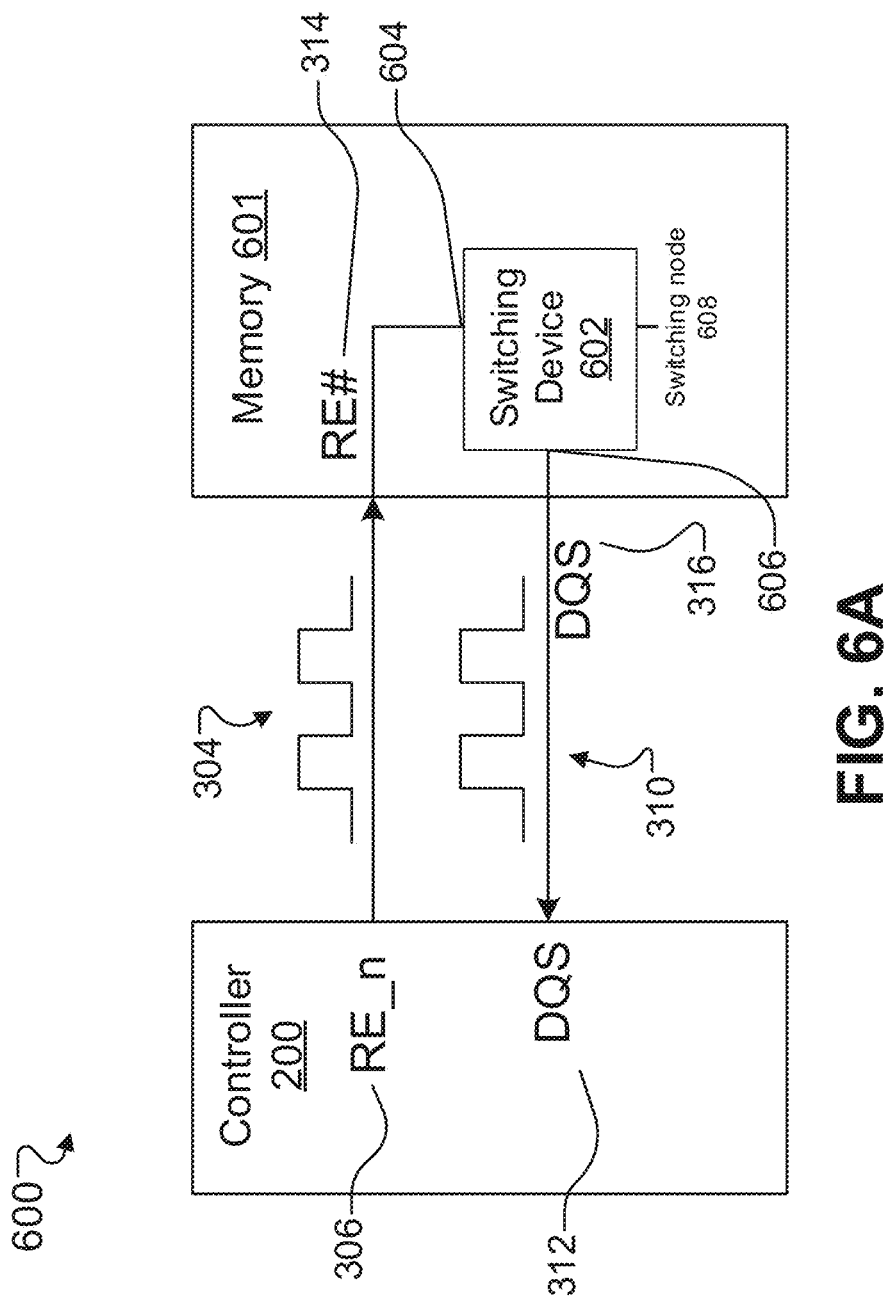
FIGS. 6A-6C illustrate examples of systems including a controller and a memory having a switching device, according to one or more implementations of the present disclosure.

FIG. 6A illustrates an example of a system 600 having the characteristics described for the system 300, except where noted otherwise. In this example, memory 601 includes a switching device 602 having an input node 604 coupled to the RE #pin 314, so that the switching device 602 receives the read enable signal 304 from the controller 200. An output node 606 of the switching device 602 is coupled to the DQS pin 316 of the memory 601. A switching node 608 of the switching device 602 is usable by the memory 302 to control whether the switching device 602 outputs the data strobe signal 310 or another signal (e.g., a constant signal) from the output node 606. The switching device 602 can be configured to output the data strobe signal 310 by transmitting the read enable signal 304 in an unaltered form through the switching device 602 (e.g., so that the data strobe signal 310 is a phase-shifted version of the read enable signal 304), or the switching device 602 can be configured to perform one or more signal processing operations, such as a wave-shaping, attenuation, amplification, filtering, and/or another operation, on the read enable signal 304 to produce the data strobe signal 310.

In some implementations, because the memory 601 includes the switching device 602, transmission of the data strobe signal 310 can be made more reliable. For example, using the switching device 602, the data strobe signal 310 can be a redirected version of the read enable signal 304, so that the memory 601 need not separately synthesize the data strobe signal 310. In some implementations, this feature can reduce a required complexity (e.g., cost and/or footprint) of circuitry of the memory 601, because the memory 601 need not include circuitry to separately synthesize the data strobe signal 310. In some implementations, this feature can allow for the data strobe signal 310 to have a frequency that more accurately matches the frequency of the read enable signal 304, because the data strobe signal 310 is not generated separately from the read enable signal 304. In some implementations, this feature can reduce power consumption by the memory 601, because power is not consumed synthesizing the data strobe signal.

Figure 6B:
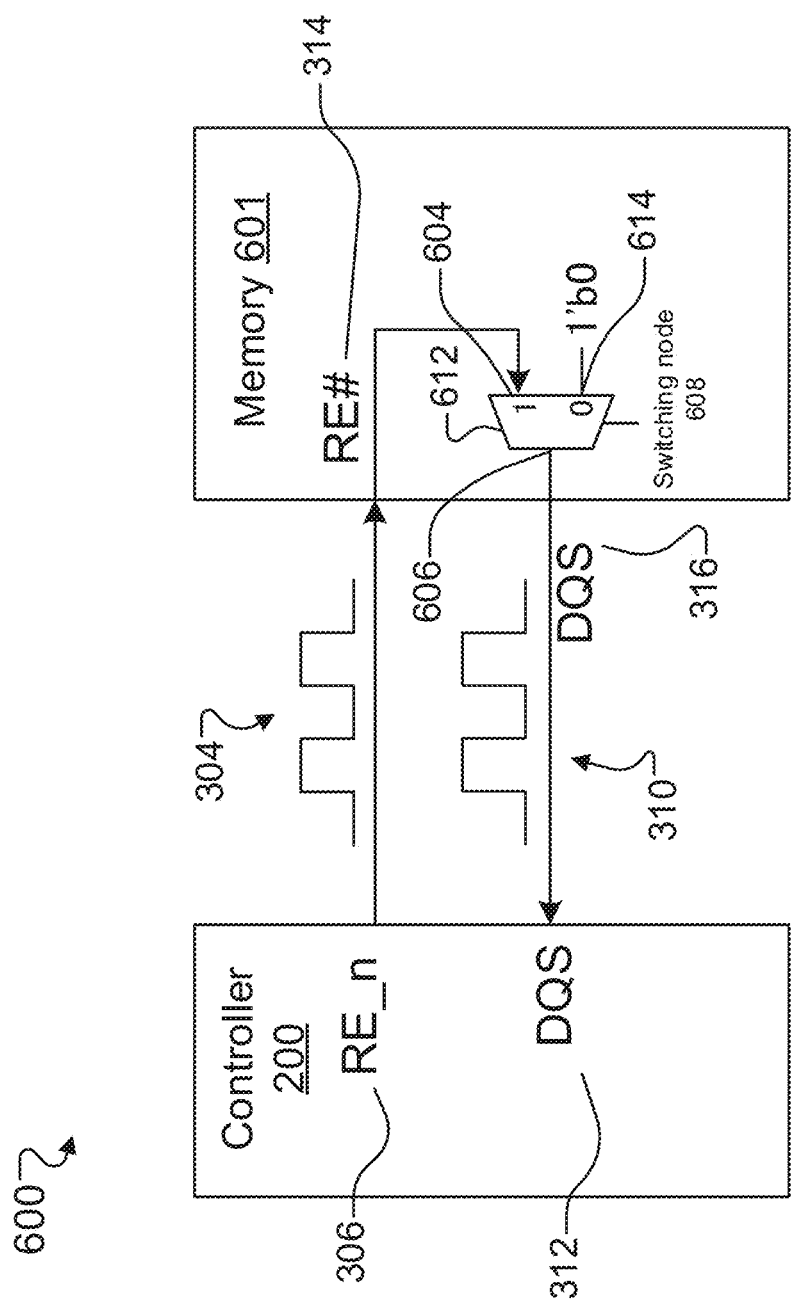

In some implementations, as shown in FIG. 6B, the switching device 602 includes a multiplexer 612. The multiplexer 612 is switchable (using the switching node 608) between transmitting a signal from the first input node 604 to the output node 606 or transmitting a signal from a second input node 614 to the output node 606. In some implementations, the second input node 614 is provided with a non-periodic signal (e.g., a constant signal or a floating signal) or a signal that has a frequency different from the frequency of the read enable signal 304. Accordingly, while the memory 601 is busy preparing requested data for transfer, the multiplexer 612 is configured (by an appropriate signal (e.g., voltage) on the switching node 608) to transmit a signal on the second input node 614 to the output node 606 and, from there, to the DQS pin 316 of the memory 601 and the DQS pin 312 of the controller 200. In response to determining that the requested data is ready for transmission to the controller 200, the memory 601 can provide, at the switching node 608, a signal that causes the read enable signal 304 to be transmitted from the first input node 604 to the output node 606, to the DQS pin 316 of the memory 601, and to the DQS pin 312 of the controller 200. Accordingly, the controller 200 receives the data strobe signal 310 as a phase-shifted version of the read enable signal 304. In the example of FIG. 6B, the signal provided to the second input node 614 is a constant low signal 1′b0, but another signal, such as a constant high signal 1′b1 or another signal, can be used instead in some implementations. In some implementations, the second input node 614 can be floating so that a floating signal is sent to the DQS pin 312.

Figure 6C:
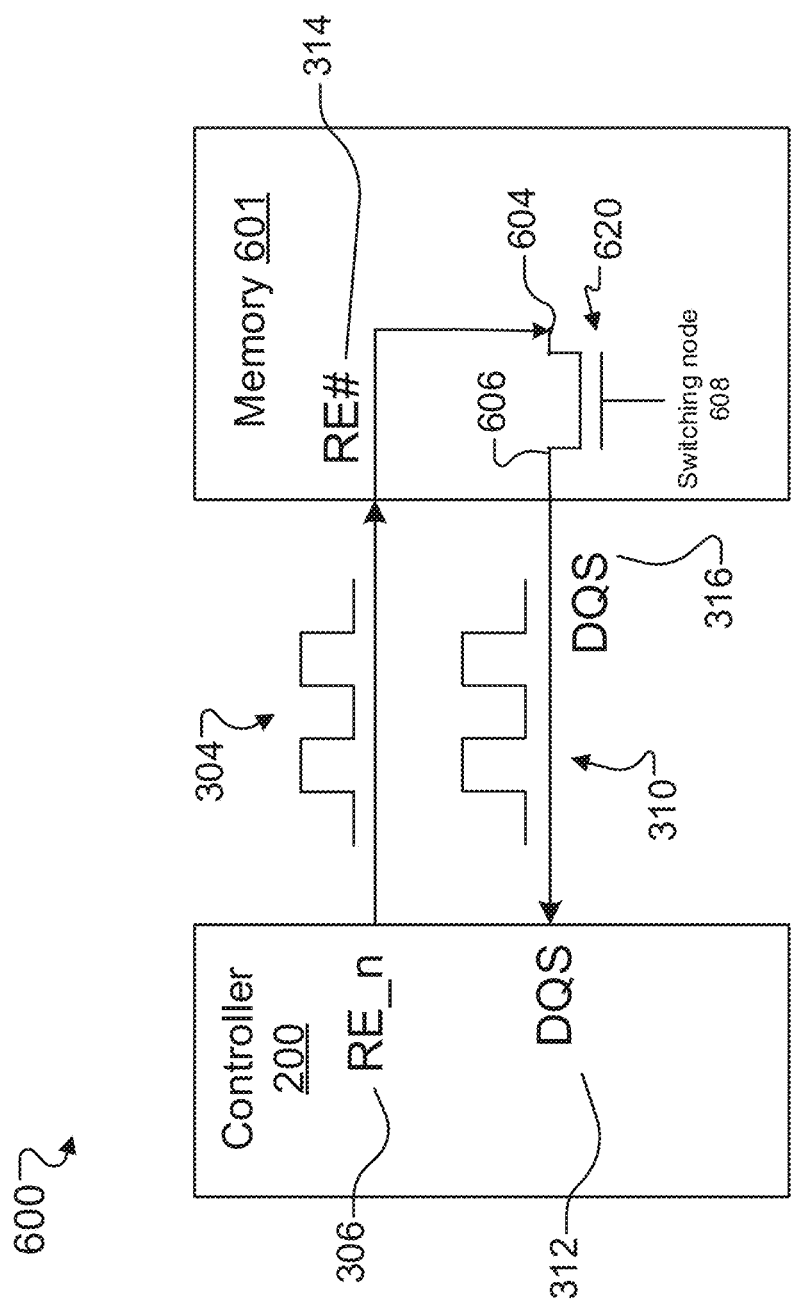

FIG. 6C illustrates a memory 601 in which the switching device 602 includes a transistor 620. The switching node 608 is a gate node of the transistor 620, so that signals provided at the switching node 608 can turn the transistor 620 on and off. While the memory 601 is busy in preparing requested data for transfer, the memory 601 provides a signal at the switching node 608 to cause the transistor 620 to be off, such that a floating signal is sent from the DQS pin 316 of the memory 601 to the DQS pin 312 of the controller 200. In response to determining that the requested data is ready for transmission to the controller 200, the memory 601 provides, at the switching node 608, a signal that causes the transistor 620 to turn on, so that the read enable signal 304 is sent from the input node 604, through a channel of the transistor 620 to the output node 606, to the DQS pin 316 of the memory 601, and to the DQS pin 312 of the controller 201 as data strobe signal 310.

Referring back to FIGS. 4A-4C, to perform data transfer, the memory continues sending the data strobe signal to the controller, and the memory also sends the requested data to the controller in synchronicity with the data strobe signal (414). For example, the memory can output the data on rising edges and/or falling edges of the data strobe signal (edge-aligned), or at peak centers of the data strobe signal (center-aligned), aligned with the timing of the data strobe signal. The data can be sent from one or more suitable pins of the memory, e.g., pins IO[7:0] pins, as described in FIG. 1B. The data can be transferred according to a protocol compatible with the memory, the controller, and any interface/bus that may couple the memory and the controller, such as single data rate (SDR), double data rate (DDR), or quad data rate (QDR) data transfer.

Correspondingly, the controller receives the data strobe signal (418) and, in response to determining that the data strobe signal has a frequency matching a frequency of the read enable signal, reads data from the memory in synchronicity with the data strobe signal (420). For example, data reading by the controller is latched to the data strobe signal, so that data is received successfully by the controller in timing alignment with the data strobe signal. Because the data strobe signal has a frequency matching a frequency of the read enable signal sent by the controller, the controller is configured to read the data with the timing dictated by the data strobe signal and, in some cases, perform operations such as data storage and/or data transfer to a separate device. This feature can reduce errors associated with data reading by the controller. The data can be received at the controller at one or more I/O pins, such as DQ[7:0] pins.

The controller can determine whether the data strobe signal has the frequency matching the frequency of the read enable signal. To determine whether the data strobe signal has the frequency matching the frequency of the read enable signal, in some implementations, the controller directly measures the frequency of the data strobe signal and compares the measured frequency to a frequency of the read enable signal. For example, the measured value and the frequency of the read enable signal can be stored in a storage (e.g., internal memory 114 of FIG. 1A), buffers, or registers of the controller, and compared, e.g., based on processing by a processor such as processor 113 of FIG. 1A. In some implementations, the controller can measure or identify a difference between the frequency of the data strobe signal and the frequency of the read enable signal, e.g., using a counter or a phase-locked loop-based circuit/method of the controller. The frequencies can be determined to match if the frequencies match exactly (e.g., within measurement error of the controller) or, in some implementations, if the frequencies match to within a threshold condition (e.g., within 2%, within 5%, or within 10%). In some implementations, the controller is configured to determine whether the frequency of the data strobe signal is within a range (such as a predetermined range or a range based on a measurement of the read enable signal), and, if the frequency of the data strobe signal is within the range, it is determined that the frequencies match. The controller can include circuitry to obtain the data strobe signal from the DQS pin and provide the data strobe signal to circuitry configured to determine whether the data strobe signal has a frequency matching that of the read enable signal. In some implementations, if the frequencies are determined not to match, the controller can perform one or more operations in response, e.g., provide an error signal and/or terminate transmission of the read enable signal.

In some implementations, the controller reads the data in response to receiving the data strobe signal, e.g., without having to determine that the frequency of the data strobe signal matches the frequency of the read enable signal.

In some implementations, the controller is configured to track an amount of received data and determine whether all requested data has been received. For example, when the controller has requested n bytes of data, the controller can track a number of received bytes. In response to determining that all requested data has been received (e.g., in response to determining that n bytes of data have been received when n bytes of data were requested), in some implementations, the controller ends transmission of the read enable signal (422).

In some implementations, the memory is configured to track an amount of sent data and determine whether all requested data has been sent to the controller. For example, when the controller has requested n bytes of data, the memory can track a number of transmitted bytes. In some implementations, in response to determining that all requested data has been sent (e.g., in response to determining that n bytes of data have been sent when n bytes of data were requested), the memory ends transmission of the data strobe signal to the controller. For example, the memory can provide a signal at a switching node (e.g., 608 of FIGS. 6A-6C) of a switching device (e.g., 602, 612, or 620 of FIGS. 6A-6C, respectively) so that a constant signal is sent to the controller instead of the read enable signal being redirected to the controller as the data strobe signal.

Compared to data transfer processes that rely on a read status command signal, some implementations according to this disclosure may provide faster data transfer. When a read status command signal is used, data transfer does not commence until the data is first ready for transmission and the memory then receives a read status command signal. However, because the read status command signal may be intermittent with relatively long pauses between transmissions of the read status command signal, the memory may end its busy phase with a significant time before a next read status command signal is received. For example, if transmissions of read status command signals are separated by 600 ns, the memory may receive a read status command signal while busy, finish preparing requested data for transfer 20 ns later, and then wait another 580 ns before another read status command signal is received. This 580 ns represents wasted time that results in slower data transfer. By contrast, in some implementations according to this disclosure, the controller initiates transmission of the read enable signal before the memory finishes preparing data for transfer (in response to determining that the predetermined time duration has elapsed, and, in some implementations, independent of a state of any signal received in response to a read status command signal), so that the memory may immediately send the data strobe signal to the controller and initiate transfer of data when the memory determines that the data is ready for transmission.

Figure 7:
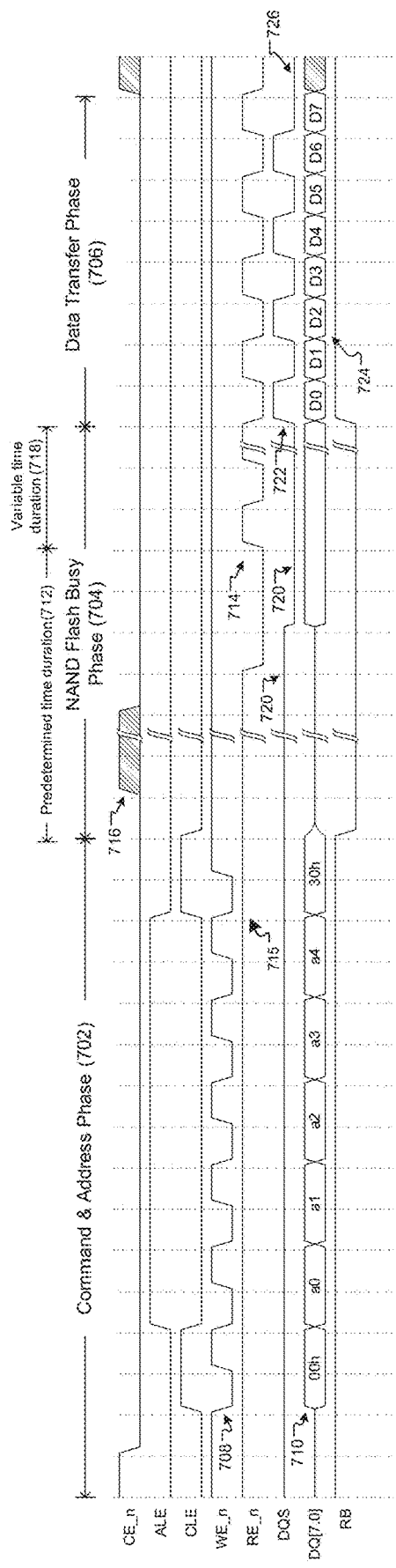
FIG. 7 is a timing diagram illustrating examples of signals, according to one or more implementations of the present disclosure.

FIG. 7 illustrates examples of signals at various pins (e.g., 202 of FIG. 2) of a controller (e.g., 200 of FIG. 2) during a data transfer process between the controller and a memory (e.g., the memory 116 of FIGS. 1A-1B, the memory 302 of FIG. 3, the memory of FIGS. 4A-4C, or the memory 601 of FIG. 6A, 6B, or 6C), such as data transfer process 400 of FIGS. 4A-4C. During a command & address phase (702), a periodic write enable signal 708 on the WE_n pin controls latching for commands 710 sent from the controller to the memory using I/O pins DQ[7:0]. The commands 710 include transmission of read instruction data requesting that the memory sends data to the controller (402), where "00 h" and "30 h" represent a start and an end of the commands 710, and "a0" to "a4" can represent addresses of the data in the memory. In response to receiving the read instruction data, during a NAND flash busy phase (704), the memory prepares the requested data for transfer (404). For a predetermined time duration 712 of the NAND flash busy phase, the controller does not output a periodic read enable signal on the RE_n pin, helping to conserve power (406). In some implementations, before the predetermined time duration has elapsed, the controller is configured to output a constant signal 715 (e.g., a high, low, or floating signal) on the RE_n pin. In response to determining that the predetermined time duration 712 has elapsed, the controller initiates transmission of the periodic read enable signal 714 to the memory (408). During the predetermined time duration 712, the controller may perform other operations as well, e.g., sending commands to other memories after selecting the other memories using appropriate signals 716 on the CE_n pin.

For a variable time duration 718 after initiation of transmission of the read enable signal 714, the memory is still busy preparing the requested data for transfer and, accordingly, a constant signal 720 is sent from the memory to the controller on the controller's DQS pin (409). For example, the constant signal 720 can be a low signal, a high signal, or a floating signal. In some implementations, the constant signal 720 is variable between multiple constant values that are each held for periods of time that are longer than a period associated with the frequency of the read enable signal/data strobe signal, e.g., the constant signal 720 may take on different values during different portions of the NAND flash busy phase 704.

At the beginning of the data transfer phase 706, the memory determines that the requested data is ready for transmission and, in response, the memory initiates transmission of the periodic data strobe signal 722 to the controller on the controller's DQS pin (412). For example, the memory can provide a signal at a switching node of a switching device (e.g., 602 of FIG. 6A), such as a transistor like 620 of FIG. 6C or a multiplexer like 612 of FIG. 6B, that causes the read enable signal 714 input to the switching device to be directed back to the controller as the data strobe signal 722. The data strobe signal 722 can have the same frequency as the read enable signal 714. In some implementations, the data strobe signal 722 is phase-shifted with respect to the read enable signal 714; in the example of FIG. 7, the phase shift is 180°. In addition, in the example of FIG. 7, both the read enable signal 714 and the data strobe signal 722 are trapezoidal clock waveforms that alternate between a high level and a low level.

As shown in FIG. 7, the data strobe signal 722 has a frequency matching a frequency of the read enable signal 714. The controller can perform a frequency comparison process, such as by counting peaks, rising edges, or falling edges of the data strobe signal 722 or both the data strobe signal 722 and the read enable signal 714 to determine whether the frequencies match, e.g., by comparing counts. In some implementations, the controller obtains a signal that is a function of the data strobe signal 722 and the read enable signal 714 (e.g., a sum/difference of the signals or a mixture of the two signals 722, 714) and determines, based on the function, whether the two signals 722, 714 have a matching frequency. In some implementations, the controller is configured to monitor the signal on the DQS pin and repeatedly determine whether the signal has a frequency matching the frequency of the read enable signal. When the DQS pin receives the constant signal 720, the controller determines that the constant signal 720 does not have a frequency matching the frequency of the read enable signal 714. When the DQS pin instead receives the data strobe signal 722, the controller determines that the data strobe signal 722 does have a frequency matching the frequency of the read enable signal 714.

In synchronicity with the data strobe signal 722 (in the example of FIG. 7, on rising and falling edges of the data strobe signal, in accordance with double data rate data transfer protocols), the memory sends the requested data to the controller using appropriate signals 724 sent to I/O pin(s) DQ[7:0] of the controller (414), and the controller reads data by sensing the signals 724 in temporal alignment with the data strobe signal 722 (418, 420). In some implementations, when the controller determines that the requested data has been fully received, the controller terminates transmission of the read enable signal 714 (422), e.g., sends a constant signal to the RE #pin of the memory from RE_n pin of the controller. In some implementations, when the memory determines that the requested data has been fully sent, the memory terminates transmission of the data strobe signal 722, e.g., sends a constant signal 726 to the DQS pin of the controller from the DQS pin of the memory.

The techniques described in the present disclosure can be implemented in different types or configurations of systems or devices, e.g., as illustrated with further details below in FIGS. 8 to 11. Each system can include a controller (e.g., the device controller 112 or host controller 122 of FIG. 1A or the controller 200 of FIG. 2, 3, 4A-4C, 6A-6C, or 7) and one or more semiconductor devices (e.g., a memory like the memory 116 of FIGS. 1A-1B, the memory 302 of FIG. 3, the memory as described in FIGS. 4A-4C, the memory 601 of FIG. 6A, 6B, or 6C, or the memory as described in FIG. 7).

Figure 8:
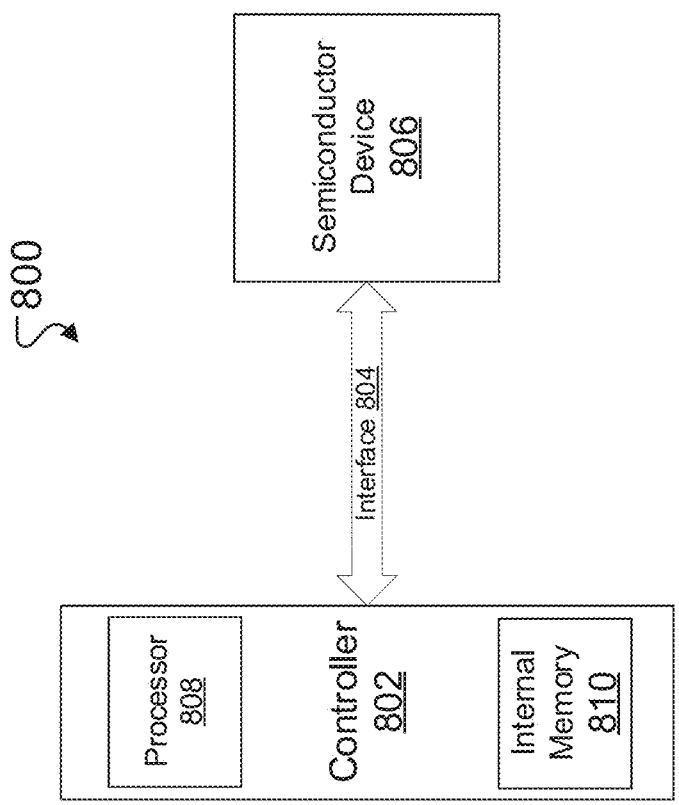
FIG. 8 illustrates an example of a system having a controller and a semiconductor device in a one-to-one configuration, according to one or more implementations of the present disclosure.

FIG. 8 illustrates an example of a system 800 including a controller 802 communicatively coupled to a semiconductor device 806 in a one-to-one configuration. The controller 802 and the semiconductor device 806 are coupled by an interface 804 through which signals from the controller 802 to the semiconductor device 806 and vice-versa are transmitted, and the controller 802 and the semiconductor device 806 are configured to communicate with one another over the interface 804, e.g., by appropriate configuration of pins (e.g., pins in the I/O port unit 132 of FIG. 1B and/or the pins 202 of FIG. 2). The controller 802 and the semiconductor device 806 are configured to perform operations so that the controller 802 reads data from the semiconductor device 806, as described in reference to FIGS. 1-7. In some implementations, the semiconductor device 806 is a flash memory device (e.g., a NAND flash device), and the interface 804 is a flash memory interface, such as an open NAND flash interface (ONFI) or a toggle interface. The interface 804 can include a bus, wirings, interconnects, and/or any other component or set of components that can carry signals between the controller 802 and the semiconductor device 806. In some implementations, the controller 802 includes a processor 808 and an internal memory 810, as described for device controller 112, processor 113, and internal memory 114 of FIG. 1A.

Figure 9:
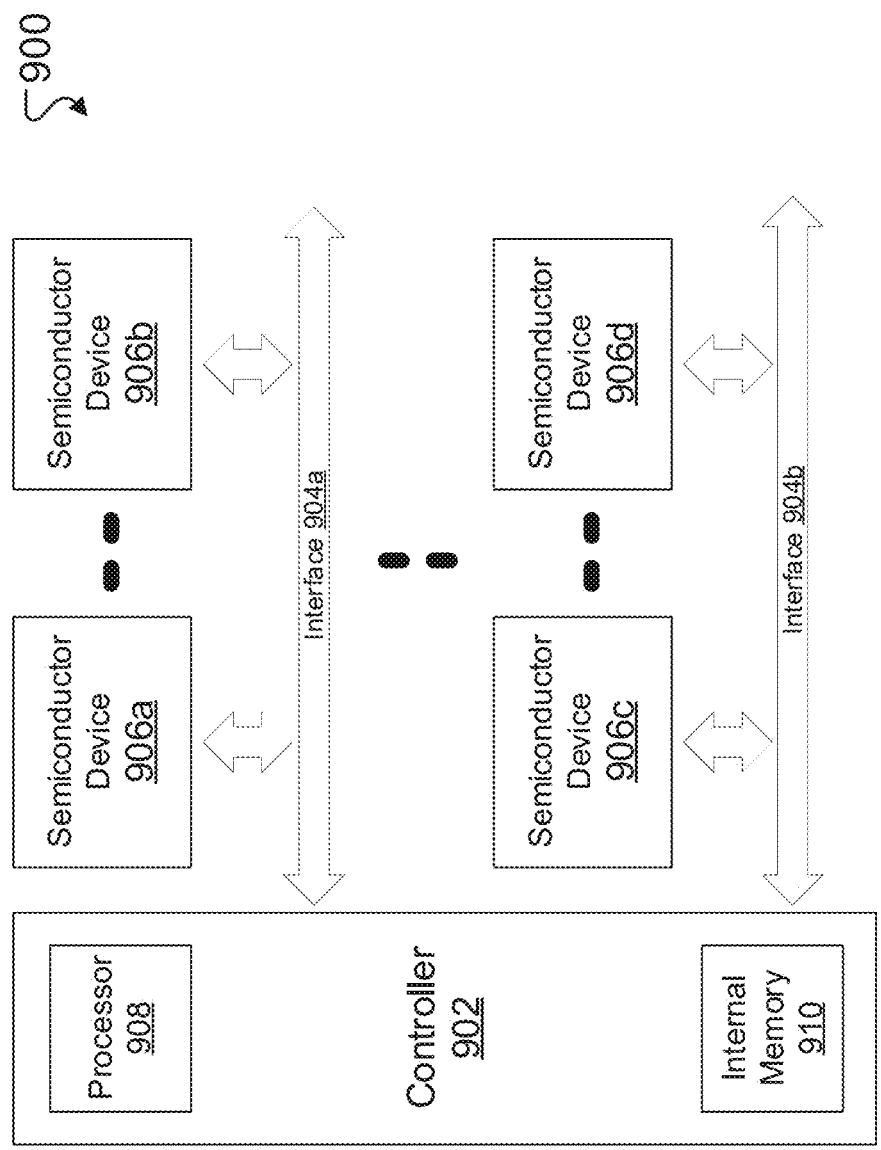
FIG. 9 illustrates an example of a system having a controller, multiple interfaces, and multiple semiconductor devices, according to one or more implementations of the present disclosure.

FIG. 9 illustrates an example of a system 900 in which a controller 902 is communicatively coupled to multiple semiconductor devices 906a-d through multiple interfaces 904a, 904b. The controller 902 can be coupled to one, two, or more interfaces 904a, 90b, and each interface 904a, 904b can be coupled to one, two, or more semiconductor devices. The controller 902 is configured to select a semiconductor device from among semiconductor devices 906a-d from which to read data (e.g., using a CE_n pin of the controller 902), and the controller 902 and the selected semiconductor device perform operations to transfer the data as described throughout this disclosure. Elements of FIG. 9 can have the characteristics described for the corresponding elements illustrated in FIG. 8.

Figure 10:
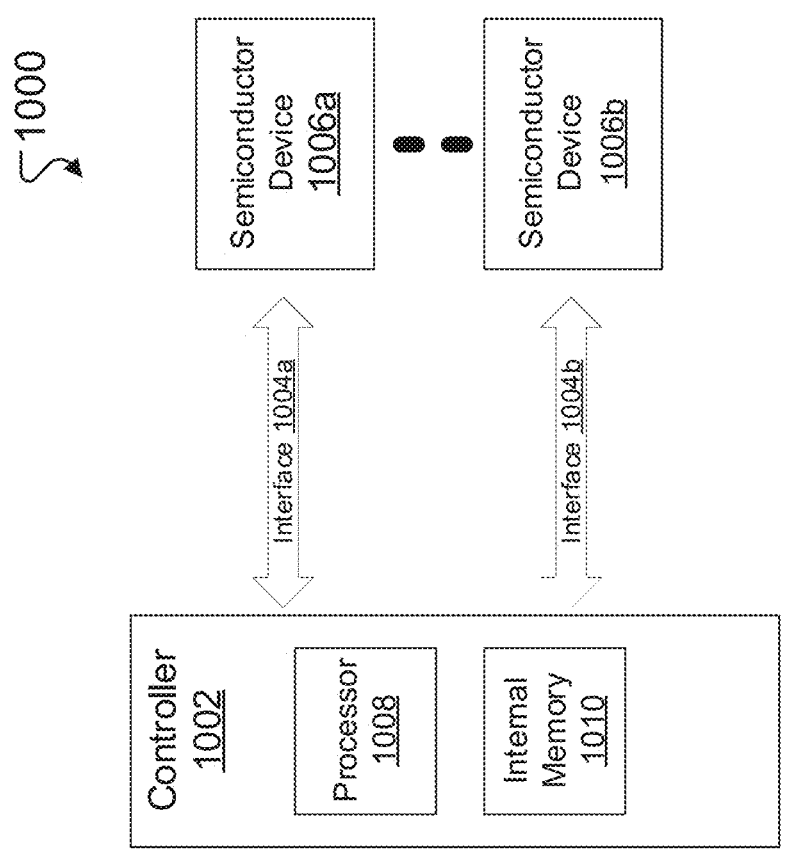
FIG. 10 illustrates an example of a system having a controller and multiple interfaces coupled to respective semiconductor devices, according to one or more implementations of the present disclosure.

FIG. 10 illustrates an example of a system 1000 in which a controller 1002 is communicatively coupled to multiple semiconductor devices 1006a, 1006b through separate interfaces 1004a, 1004b, where the interfaces 1004a, 1004b are provided in a one-to-one relationship with the semiconductor devices 1006a, 1006b. The controller 1002 is configured to select a semiconductor device from among semiconductor devices 1006a, 1006b from which to read data, and the controller 1002 and the selected semiconductor device perform operations to transfer the data as described throughout this disclosure. Elements of FIG. 10 can have the characteristics described for the corresponding elements illustrated in FIGS. 8-9.

Figure 11:
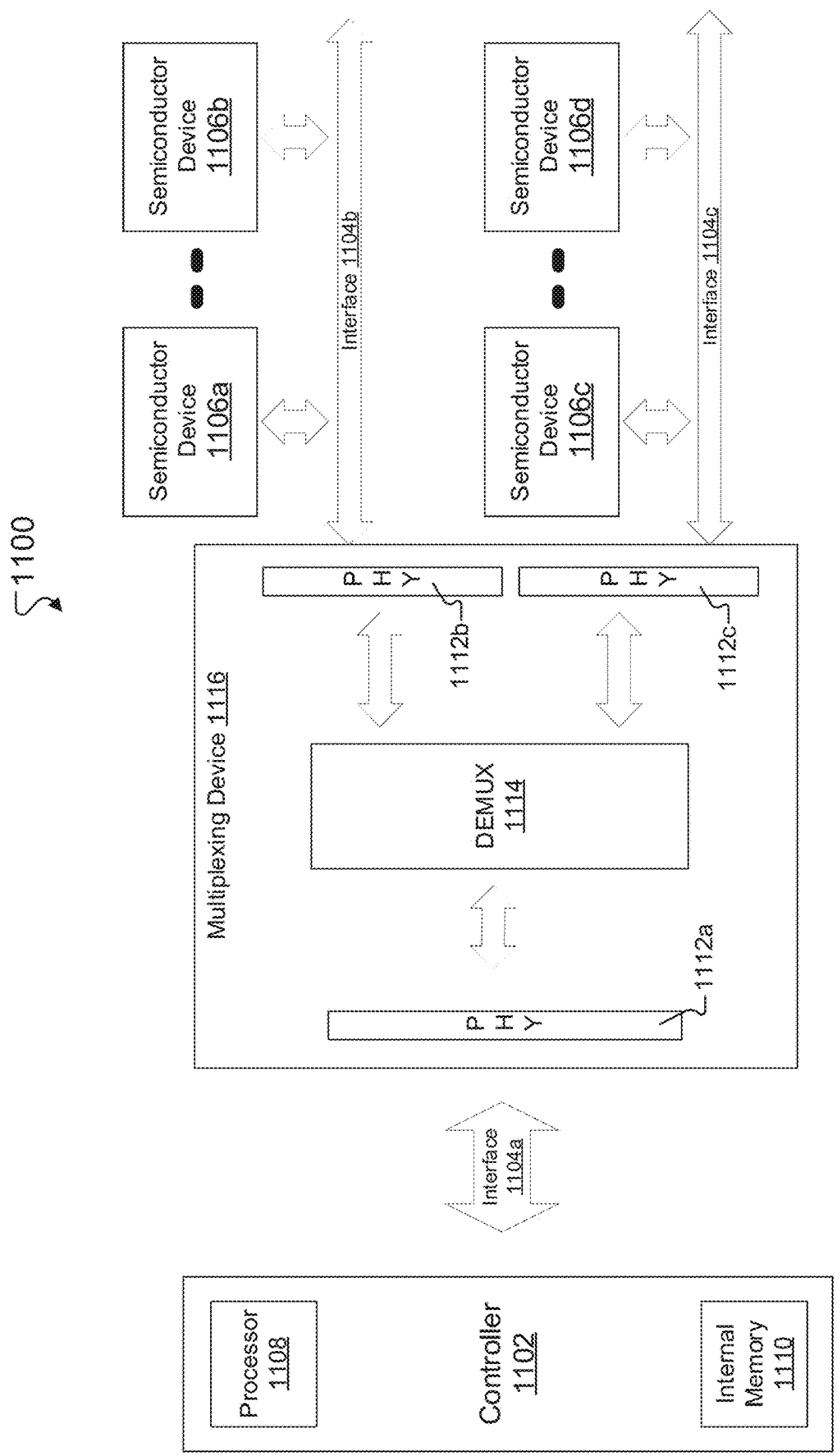
FIG. 11 illustrates an example of a system having a controller, a multiplexing device, and multiple semiconductor devices, according to one or more implementations of the present disclosure.

FIG. 11 illustrates an example of a system 1100 in which a controller 1102 is communicatively coupled to multiple semiconductor devices 1106a-d through a single interface 1104a from the controller 1102. The interface 1104a couples the controller 1102 to a physical layer 1112a (PHY) of a multiplexing device 1116, such as a discrete or integrated multiplexing chip. A demultiplexer 1114 (DEMUX) of the multiplexing device 1116, which may be implemented using software, hardware (e.g., a specialized demultiplexing circuit), or a combination thereof, is configured to switch the common input/out from the controller 1102 over the interface 1104a among multiple interfaces 1104b, 1104c, which are each coupled to the multiplexing device 1116 by a respective PHY 1112b, 1112c, and which are each coupled to one or more semiconductor devices 1106a-d. The PHYs 1112a-c include low-level interconnecting software and/or hardware layers that are configured for compatibility with the interfaces 1104a-c, controller 1102, and semiconductor devices 1106a-d. For example, when the semiconductor devices 1106a-1106d are flash memories, the PHYs 1112a-c can be ONFI PHYs or toggle PHYs. The controller 1102 is configured to select a semiconductor device from among semiconductor devices 1106a-d from which to read data, and the controller 1102 and the selected semiconductor device perform operations to transfer the data as described throughout this disclosure. Elements of FIG. 11 can have the characteristics described for the corresponding elements illustrated in FIGS. 8-10.

The disclosed and other examples can be implemented as one or more computer program products, for example, one or more modules of computer program instructions encoded on a computer readable medium for execution by, or to control the operation of, a data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can be included in a controller and/or in a semiconductor device such as a memory. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A system comprising:
   a semiconductor device configured to store data; and
   a controller communicatively coupled to the semiconductor device and configured to:
   send, to the semiconductor device, an instruction requesting transmission of the data,
   in response to determining that a predetermined time duration has elapsed after sending the instruction, initiate transmission of a read enable signal to the semiconductor device,
   receive, from the semiconductor device, a data strobe signal, and
   in response to determining that the data strobe signal has a frequency matching a frequency of the read enable signal, read the data from the semiconductor device.

2. The system of claim 1, wherein the predetermined time duration is based on a device type of the semiconductor device.

3. The system of claim 1, wherein the predetermined time duration is based on a number of bits stored in each cell of the semiconductor device.

4. The system of claim 1, wherein the predetermined time duration is based on an amount of the data.

5. The system of claim 1, wherein the controller comprises a timer configured to track a period of time after sending the instruction requesting the transmission of the data, and wherein the controller is configured to determine that the predetermined time duration has elapsed by determining that the period of time tracked by the timer reaches a value of the predetermined time duration.

6. The system of claim 1, wherein the controller comprises a read enable pin and is configured to:
   in a time period between sending the instruction and initiating the transmission of the read enable signal, send a constant signal to the semiconductor device through the read enable pin, and
   in response to determining that the predetermined time duration has elapsed after sending the instruction, initiate transmission of the read enable signal to the semiconductor device through the read enable pin.

7. The system of claim 1, wherein the data strobe signal comprises a phase-shifted version of the read enable signal.

8. The system of claim 1, wherein the controller comprises a strobe signal pin, and wherein the semiconductor device is configured to:
   in response to receiving the instruction requesting transmission of the data, prepare the data for transmission,
   determine that the prepared data is ready for transmission, and
   in response to determining that the prepared data is ready for transmission, send, to the strobe signal pin of the controller, the data strobe signal.

9. The system of claim 8, wherein the semiconductor device is configured to:
   in response to determining that the prepared data is ready for transmission, send the data to the controller in synchronicity with the data strobe signal sent to the controller.

10. The system of claim 8, wherein the semiconductor device is configured to:
    send, to the strobe signal pin of the controller, a constant signal,
    wherein the semiconductor device is configured to send the data strobe signal to the controller by switching from (i) sending the constant signal to the strobe signal pin to (ii) sending the data strobe signal to the strobe signal pin.

11. The system of claim 8, wherein the semiconductor device comprises a transistor, the transistor comprising:
    an input node arranged to receive the read enable signal,
    an output node communicatively coupled to the strobe signal pin of the controller, and
    a switching node,
    wherein the semiconductor device is configured to send the data strobe signal by providing, at the switching node, a signal that causes the data strobe signal to be sent from the output node to the controller.

12. The system of claim 8, wherein the semiconductor device comprises a multiplexer, the multiplexer comprising:
    a first input node arranged to receive the read enable signal,
    a second input node arranged to receive a constant signal from a line of the semiconductor device,
    an output node communicatively coupled to the strobe signal pin of the controller, and
    a switching node,
    wherein the semiconductor device is configured to send the data strobe signal to the controller by providing, at the switching node, a signal that switches the multiplexer from (i) providing the constant signal from the second input node at the output node to (ii) providing the data strobe signal, associated with the read enable signal from the first input node, at the output node.

13. The system of claim 1, wherein the controller is configured to:
    in response to determining that the data has been read from the semiconductor device, end transmission of the read enable signal to the semiconductor device.

14. The system of claim 1, wherein the controller is configured to read the data from the semiconductor device by synchronizing data reading with the data strobe signal received from the semiconductor device.

15. The system of claim 1, comprising a communication bus coupling the semiconductor device to the controller.

16. A semiconductor device comprising:
    a read enable in pin; and
    a strobe signal out pin,
    wherein the semiconductor device is configured to:
        receive, from a controller, an instruction requesting transmission of data,
        in response to receiving the instruction requesting transmission of the data, prepare the data for transmission,
        receive, at the read enable in pin, from the controller, a periodic read enable signal before the data is ready for transmission,
        a variable time subsequent to receiving the periodic read enable signal, determine that the prepared data is ready for transmission, wherein a frequency of the periodic read enable signal before the data is ready for transmission matches a frequency of the periodic read enable signal after the prepared data is ready for transmission, and
        in response to determining that the prepared data is ready for transmission, send, to the controller from the strobe signal out pin, a data strobe signal having a frequency matching the frequency of the periodic read enable signal after the prepared data is ready for transmission.

17. The semiconductor device of claim 16, comprising a transistor, the transistor comprising:
    an input node arranged to receive the periodic read enable signal,
    an output node communicatively coupled to the strobe signal out pin, and
    a switching node,
    wherein the semiconductor device is configured to send the data strobe signal by providing, at the switching node, a signal that causes the data strobe signal to be sent from the output node to the controller.

18. The semiconductor device of claim 16, comprising a multiplexer, the multiplexer comprising:
    a first input node arranged to receive the periodic read enable signal,
    a second input node arranged to receive a constant signal from a line of the semiconductor device,
    an output node communicatively coupled to the strobe signal out pin, and a switching node,
wherein the semiconductor device is configured to send the data strobe signal to the controller by providing, at the switching node, a signal that switches the multiplexer from (i) providing the constant signal from the second input node at the output node to (ii) providing the data strobe signal, associated with the periodic read enable signal from the first input node, at the output node.

19. A device controller comprising:
a read enable pin;
a strobe signal pin;
at least one processor; and
at least one non-transitory medium storing instructions executable by the at least one processor to:
    send, to a semiconductor device communicatively coupled to the device controller, an instruction requesting transmission of data,
    in response to determining that a predetermined time duration has elapsed after sending the instruction, initiate transmission of a read enable signal to the semiconductor device from the read enable pin,
    receive, from the semiconductor device at the strobe signal pin, a data strobe signal, and
    in response to determining that the data strobe signal has a frequency matching a frequency of the read enable signal, read the data from the semiconductor device.

20. The device controller of claim 19, wherein the predetermined time duration is based on a number of bits stored in each cell of the semiconductor device or an amount of the data.

21. The semiconductor device of claim 16, wherein preparing the data for transmission comprises loading the data into a buffer.

* * * * *